United States Patent
Ito et al.

(10) Patent No.: US 7,215,305 B2
(45) Date of Patent: May 8, 2007

(54) ELECTROLUMINESCENT ELEMENT AND DISPLAY

(75) Inventors: Nobuyuki Ito, Tokyo-to (JP); Norihito Ito, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 348 days.

(21) Appl. No.: 10/687,450

(22) Filed: Oct. 16, 2003

(65) Prior Publication Data

US 2004/0207577 A1    Oct. 21, 2004

(30) Foreign Application Priority Data

Oct. 17, 2002    (JP)    ............... 2002-303019

(51) Int. Cl.
*G09G 3/30*    (2006.01)
(52) U.S. Cl. ................. 345/76; 345/77; 345/698
(58) Field of Classification Search ........... 345/76–79, 345/103, 698, 695, 696; 315/169.3, 169.1
See application file for complete search history.

(56) References Cited

U.S. PATENT DOCUMENTS

| | | | |
|---|---|---|---|
| 4,356,429 A | 10/1982 | Tang | |
| 6,429,601 B1 * | 8/2002 | Friend et al. | 315/169.3 |
| 6,469,450 B2 * | 10/2002 | Kimura | 315/169.3 |
| 6,878,312 B1 | 4/2005 | Kanbe et al. | |
| 6,879,307 B1 * | 4/2005 | Stern | 345/84 |
| 6,956,553 B2 * | 10/2005 | Tsutsui et al. | 345/94 |
| 2002/0056838 A1 * | 5/2002 | Ogawa | 257/59 |
| 2003/0142043 A1 * | 7/2003 | Matsueda | 345/30 |
| 2004/0021136 A1 * | 2/2004 | Matsuo et al. | 257/1 |
| 2004/0239861 A1 * | 12/2004 | Uchida | 349/149 |
| 2005/0236970 A1 * | 10/2005 | Matsudate et al. | 313/500 |

FOREIGN PATENT DOCUMENTS

| | | |
|---|---|---|
| JP | 57-051781 | 3/1982 |
| JP | 03-273087 | 12/1991 |
| JP | 2001-085161 | 3/2001 |
| JP | 2002-164181 | 6/2002 |
| WO | WO 00/59267 | 10/2000 |

* cited by examiner

*Primary Examiner*—Regina Liang
(74) *Attorney, Agent, or Firm*—Ladas & Parry LLP

(57) ABSTRACT

The present invention relates to an electroluminescent (EL) element comprising at least a substrate, an electrode formed on the substrate and an electric light emitting layer and to a display using this element as pixel unit. The object of the present invention is to provide a display without property deterioration due to heating of the EL layer or remaining of the solvent, and is practical though the thickness of the film is uneven. A display comprising the electroluminescent element, wherein the light emitting region is changed by the applied voltage, as a pixel unit wherein the display is driven by a digital gradation driving method in which a low voltage value at which the pixel dose not emit light is a non-selected state, and a high voltage value at which the light emitting region within the pixel is saturated is a selected state. By using the present invention, though the film thickness is not even, a practical display with excellent gradation control property can be provided.

16 Claims, 6 Drawing Sheets

ELECTROLUMINESCENT ELEMENT AND DISPLAY

BACKGROUND OF THE INVENTION

1. Field of the Invention

The present invention relates to an information display. Particularly, the present invention relates to a self light emitting display, further, to an electroluminescence (EL) display. Moreover, the present invention relates to an electronic device using the above mentioned display as its display.

2. Description of the Related Art

Recently, flat displays are used in many fields and places, and the importance is growing with the progressing of computerization. Nowadays, the typical examples of flat displays are liquid crystal displays (LCD), however, as flat displays based on a different display mode from that of LCD, organic EL, inorganic EL, plasma display panels (PDP), light emitting diode displays (LED), vacuum fluorescent displays (VFD), field emission displays (FED), and the like are being actively developed. These new flat displays are all called a display of self light emitting type, and are significantly different from LCD in the following points and have excellent features not observed in LCD.

LCD is called a light receiving type in which a liquid crystal itself does not emit light and acts as so-called shutter allowing permeation and shutoff of outer light, constituting a display. Therefore, it needs a light source, and in general, a back light is necessary. In contrast, that of light emitting type does not require a separate light source since the apparatus itself emits light. In those of light receiving type such a LCD, a back light is constantly on, irrespective of the form of displaying information, and electric power approximately the same as that under the entire display condition is consumed. In contrast, that of self light emitting type has a theoretical merit that consumption of electric power is smaller as compared with a display of a light receiving type since only portions required to be on depending on display information consume electric power.

Likewise, in LCD, since dark condition is obtained by shading light of a back light source, it is difficult to inhibit light leakage completely, even in small quantity, while in a display of self light emitting type, no light emitting condition is directly dark condition, therefore, theoretical dark condition can be obtained easily, and a display of self light emitting type is overwhelmingly excels also in terms of the contrast.

Since LCD utilizes polarization control by double refraction of liquid crystal, there is so-called strong visibility angle dependency, which display condition varies significantly depending on observing direction, while in the case of a display of self light emitting type, this problem scarcely happens.

Further, since LCD utilizes alignment change derived from the dielectric anisotropy of liquid crystal which is an organic elastic substance, the response time against electric signals is theoretically 1 ms or more. In contrast, in the above-mentioned technologies being developed, so-called carrier transition such as electron/hole, electron discharge, plasma discharge and the like are utilized. Consequently, the response time is in "ns" order, and incomparably faster than that of liquid crystal, causing no problem of remaining of animation derived from slowness of the response of LCD.

Among them, study of organic EL is particularly active. Organic EL is also referred to as OEL (Organic EL) or organic light emitting diode (OLED: Organic Light Emitting Diode).

An OEL element and OLED element have a structure in which a layer (EL layer) containing an organic compound is sandwiched in between a pair of electrodes of an anode and a cathode, and a lamination structure of "anode electrode/hole injection layer/light emitting layer/cathode electrode" such as of Tang etc. is a basic structure (see Japanese Patent No. 1526026).

While a low molecular weight material such as Tangs etc. is used, Nakano et al. use a high molecular weight material (see Japanese Patent Application Laid-Open (JP-A) No. 3-273087).

Further, improvement in efficiency using a hole injection layer or electron injection layer, or control of light emitting color by doping a fluorescent dye and the like to a light emitting layer, are also conducted.

As the method for manufacturing a display using organic EL, formation of a light emitting layer by discharging a light emitting material using an ink jet discharging apparatus is known, and some methods are conventionally suggested (for example, see JP-A No. 2002-164181, International Publication No. 00/59267 pamphlet, JP-A No. 2001-85161 and JP-A No. 2001-341296).

Figure 4:
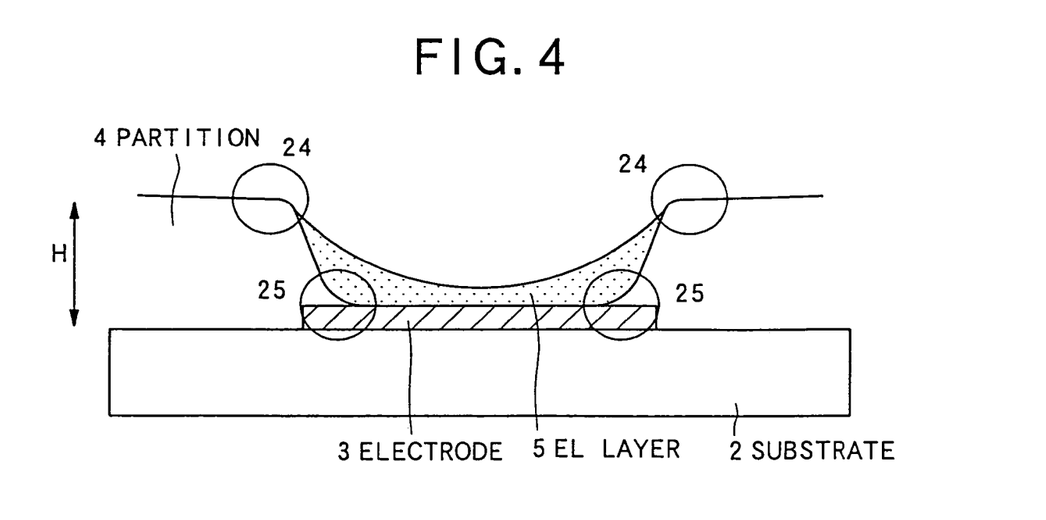
FIG. 4 is a sectional constitutional view of an improved conventional display.

In conventional methods, as described below, an electrode disconnection at a partition corner part which retains light emitting material ink in the form of solution and unevenness of the EL layer thickness due to a meniscus phenomenon are major problems. In JP-A No. 2002-164181, by smoothing the form of a partition as shown in FIG. 4, a problem of disconnection at a partition corner part can be solved. However, a problem of uneven thickness of an EL layer due to a meniscus phenomenon is not solved.

The problem of uneven thickness due to a meniscus phenomenon occurs not only in an EL light emitting layer but also in other functional layers, for example, a hole injection layer, hole transportation layer, electron injection layer and electron transportation layer when formed from a solution.

In manufacturing method for organic EL display by ink jet method, a method of evaporation drying a solvent forcibly, when the light emitting layer in the form of ink solvent is formed into a film, is already reported as a conventional method for solving the problem.

For example, in the International Publication No. 00/59267 pamphlet, a light emitting material which has been made into ink using a solvent having high boiling point is fed and distributed on a substrate, then, the substrate is heat treated. This procedure is performed to obtain an effect of drying a substrate by heating, even after formation of a light emitting layer on the entire surface of a substrate, by using a solvent of high boiling point to slow the evaporation speed of the solvent and to elongate air drying time. However, removing of a solvent of high boiling point completely cannot avoid a problem that heating treatment at higher temperature is necessary, leading to deterioration of a light emitting material. Though deterioration is not observed in the initial light emitting property, this problem exerts a large influence particularly on shortening of light emitting life. If heating treatment is not conducted at sufficient high temperature, a problem of heat deterioration of a light emitting layer will not occur, however, its leads to significant deterioration of the reliability of a light emitting layer due to the remaining of a solvent in a light emitting layer formed as a film.

In the JP-A No. 2001-85161, heating treatment is conducted at higher temperature than the softening point of a material of a light emitting layer, and there is a problem of deterioration as described above.

Figure 5:
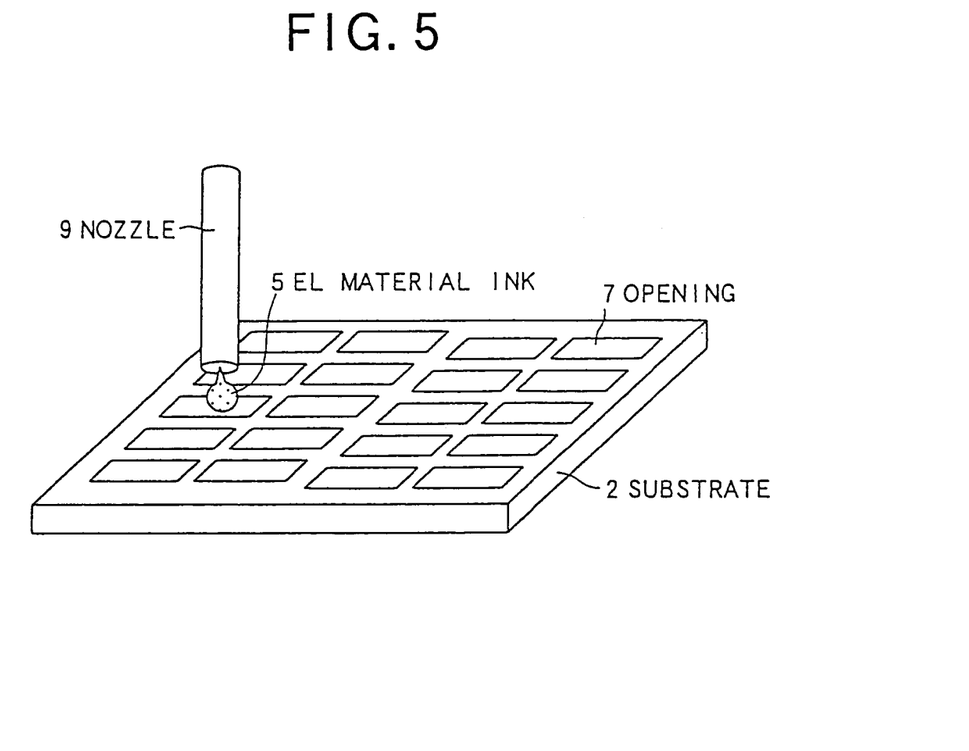
FIG. 5 is a constitutional view showing a method for manufacturing an organic EL display by an ink jet method.

The method for manufacturing an organic EL display by an ink jet method will be described. As shown in FIG. 5, an EL material ink in the form of solution is precisely discharged to predetermined openings on a substrate by a finely processed nozzle.

Figure 3:
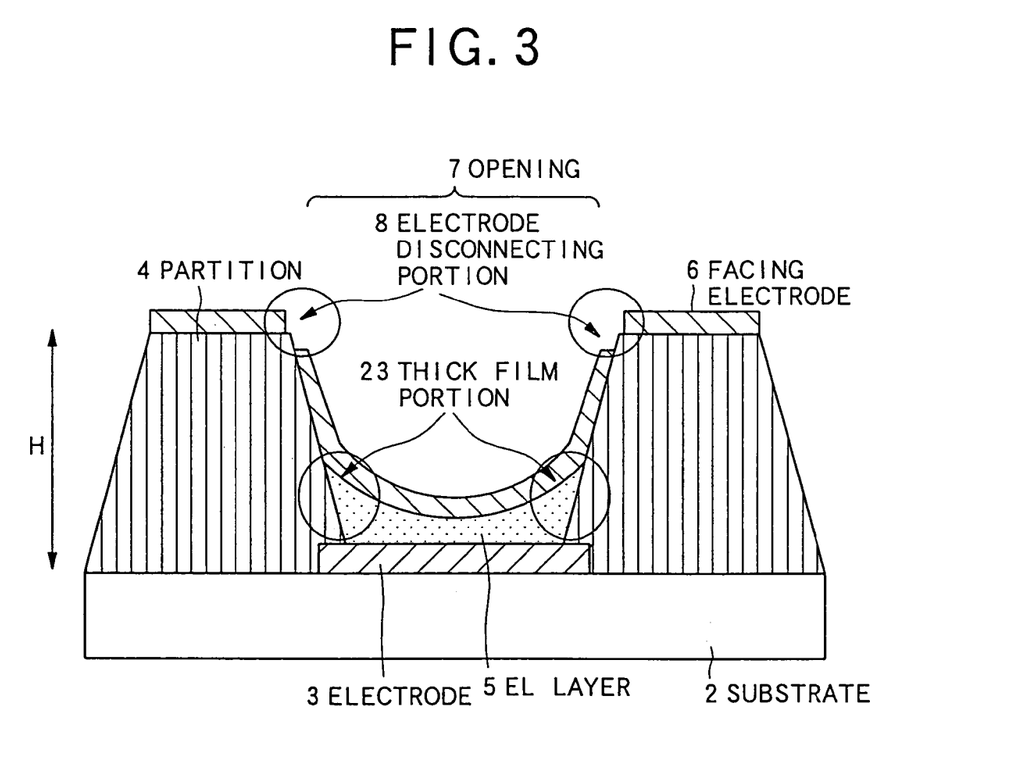
FIG. 3 is a sectional constitutional view of a conventional display.
Figure 6:
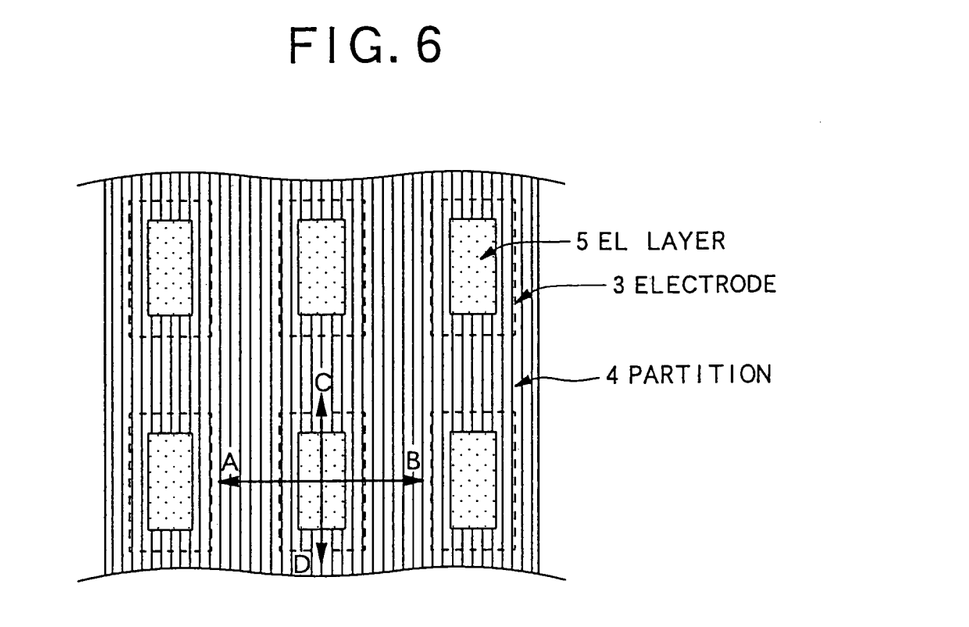
FIG. 6 is a front view of a pixel arrangement of a display of the present invention.

Usually, when a light emitting layer is formed by an ink jet method, a light emitting material ink is discharged per one pixel in a dot, as shown in FIG. 6. Partitions are formed according to this. FIGS. 3 and 4 show cross sectional view of an arrow AB or an arrow CD of FIG. 6.

Figure 7:
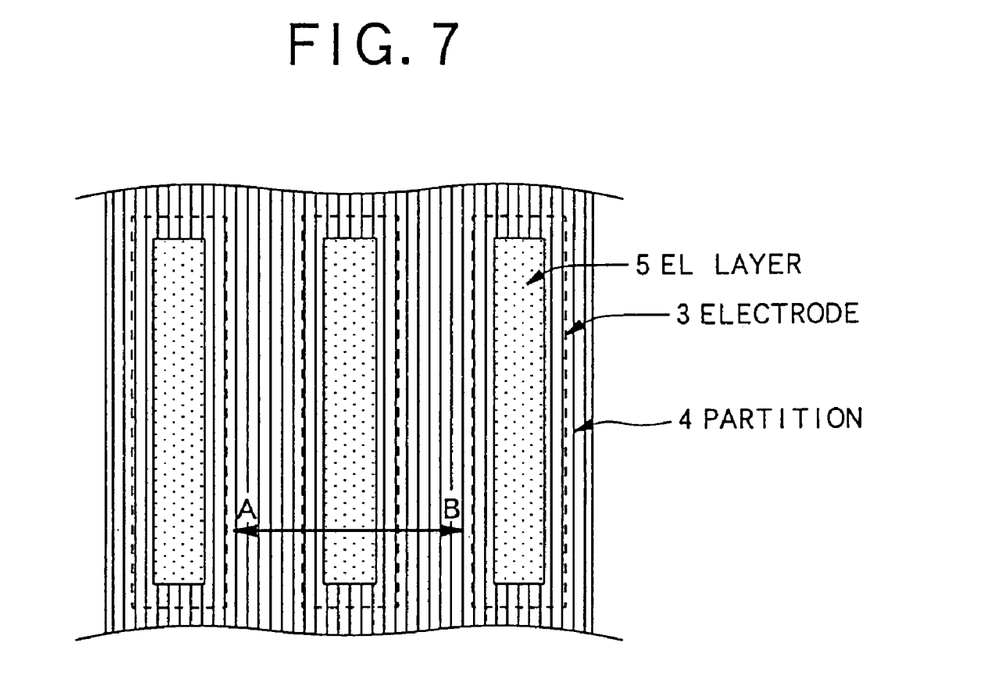
FIG. 7 is another front view of a pixel arrangement of a display of the present invention.

When light emitting layers of the same light emitting color are formed for plural adjacent pixels, such as a data line of passive matrix display, or even for an active matrix display when pixels are arranged in stripes, light emitting layers of the same color can be formed on the data line as well. In such a case, partition openings can also be formed in lines as shown in FIG. 7. In this case, in addition to the ink jet method, formation of a light emitting layer by so-called dispenser method is also possible.

In FIG. 5, the surface of the substrate is drawn as a flat surface. However, actually as shown in FIG. 3, there are partitions having a height of about 5 μm is formed on a substrate to retain the discharged ink. When the solution is discharged to inside of such fine partitions, formation of so-called meniscus surface condition, by the surface tension of liquid, cannot be avoided. When an EL material ink is dried by evaporation of a solvent under this meniscus surface condition, the meniscus surface condition as ink state is reflected as it is, and the thickness of an EL layer becomes uneven as shown in FIG. 3.

When an EL material ink is dried by evaporation of a solvent under this meniscus surface condition, the meniscus surface condition as ink state is reflected as it is, and the thickness of an EL layer becomes uneven as shown in FIG. 3. Conventionally, with such an EL layer having uneven thickness, even light emitting condition within a pixel could not be obtained. Particularly, there was a problem that gradation displaying control, which is a half tone, is difficult.

Otherwise, a problem of disconnection of facing electrodes is also important. Usually, since a facing electrode is formed by vapor depositing a metal thin film, thickness from 100 nm to at most 500 nm is a limitation for stable formation. When thicker than this, a risk of peeling increases due to the tension of a metal itself since it is no longer a thin film. With thickness in this range, when a partition has a height of 5 μm or more, disconnection tends to occur at a corner part of a partition 200, as shown in FIG. 3, and a lot of defective pixels occur in which electric field is not applied to an EL layer.

In the above, a case where an EL layer is formed by an ink jet method is mainly explained. That is because the problem of uneven thickness is most likely to occur remarkably when ink jet method is used. However, in cases where an EL layer is formed by other methods, it is not easy to completely solve the problem of uneven thickness within a pixel. For example, in casting method, layer-by-layer self-assembling method, spin coating method, dipping method, and the like, the problem of uneven thickness as same as an ink jet method will likely to occur since they are wet processes. Further, in vapor deposition method, cases where partitions as the above are used in order to keep a mask and a substrate surface from being in contact. And in that case, the thickness may become uneven near the partitions, leading to the same problem in such a case.

SUMMARY OF THE INVENTION

The present application has been accomplished in view of the above mentioned point, and the object is to provide a display which no property deterioration of EL layer occurs from heating or remaining of solvent, and is practical though its thickness is uneven.

Moreover, also in an inorganic spreading EL or the like of a coating type in which the problem as mentioned above will occur, the problem can be solved by the present invention.

The present invention can solve the above mentioned problems with a display comprising an electroluminescent element, wherein a light emitting region changes according to a voltage applied to a light emitting layer, as a pixel unit; wherein the display is driven by a digital gradation driving method in which a low voltage value at which the pixel dose not emit light is a non-selected state, and a high voltage value at which the light emitting region within the pixel is saturated is a selected state. As the digital gradation driving methods, the display can be driven by a time divisional gradation (sub-field method) driving method, an area divisional gradation (sub-pixel method) driving method or a combination of the time divisional gradation driving method and area divisional gradation driving method.

Further, the present invention is useful particularly when a material of solution type is formed by an ink jet method. However, even when other wet processes are used or when a material of non-solution type is formed by vapor deposition, for example, the problem can be solved with the present invention as well by a characteristic of the light emitting region being changed by a voltage.

By using the present invention, a practical display of an excellent gradation display can be manufactured without deteriorating the property of the electroluminescent material.

Further, a practical electronic device equipped with this display can be provided.

DESCRIPTION OF THE PREFERRED EMBODIMENTS

Embodiments of the present invention will be illustrated in detail referring to drawings.

In this specification, a pixel electrode and facing electrode correspond to either an anode or cathode so as to constitute a pair of electrodes. All layers provided in between them are generically called EL layers, and the hole injection layer, hole transportation layer, light emitting layer, electron injection layer and electron transportation layer are included in this.

Figure 8:
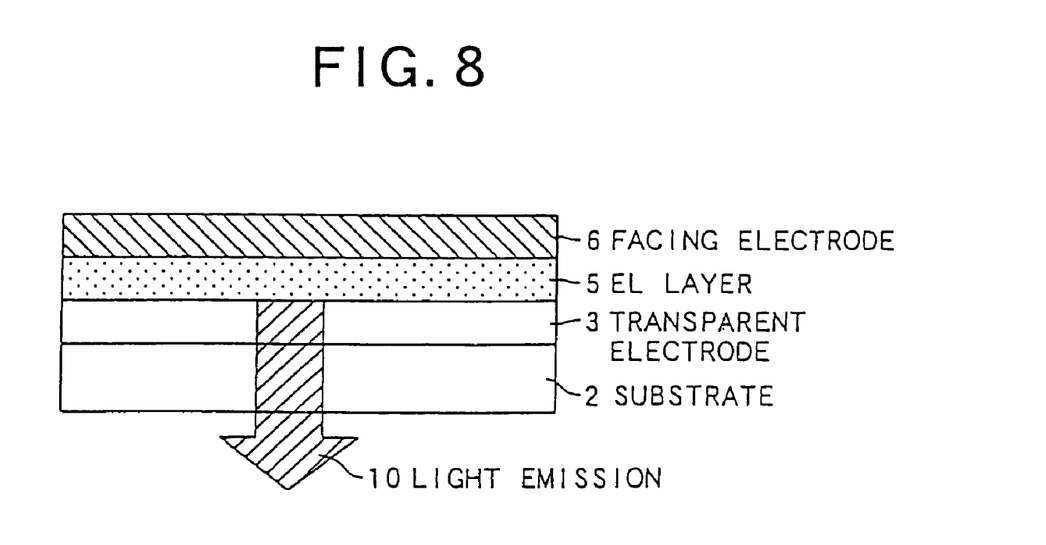
FIG. 8 is a sectional constitutional view of an organic EL element.

FIG. 8 shows the sectional structure of an organic EL element.

Organic EL emits light when electric field is applied to electrodes and electric current is passed through an EL layer. Conventionally, only fluorescent emission due to returning from singlet excited state to ground state was used, however, as results of recent studies, phosphorescence emission due to returning from triplet excited state to ground state can be utilized effectively and efficiency is improved.

Usually, a translucent electrode 3 is formed on a translucent substrate 2 such as a glass substrate and plastic substrate, then, an EL layer 5 and a facing electrode 6 are formed in this order. In general, an anode is constituted of a translucent electrode such as ITO and the like, and a cathode is a non-translucent electrode constituted of a metal, in many cases.

Though not shown in FIG. 8, since an organic EL element shows remarkable deterioration in properties by moisture and oxygen, in general, reliability thereof is insured by filling an inert gas so that an element does not contact to moisture and oxygen, then, using another substrate, or conducting so-called sealing by vapor deposition of a thin film.

When an organic EL element is used as a display, the mode can be roughly classified into a passive matrix mode and active matrix mode depending on the electrode constitution and driving method, as for LCD. In the passive matrix mode, a pair of electrodes is constituted of a horizontal electrode and vertical electrode mutually crossing while sandwiching an EL layer so that its structure is simple. However, for displaying an image, moment brightness has to be enhanced by the multiple of the number of scanning lines by time divisional scanning, and in displays of usual VGA or more, moment brightness of organic EL of over 10000 $cd/m^2$ is necessary, causing a lot of practical problems as a display. In the active matrix mode, a pixel electrode is formed on a substrate on which TFT or the like is formed, and an EL layer and facing electrodes are formed, namely, its structure is complicated as compared with the passive matrix method, however, it is advantageous as an organic EL display in many points such as light emitting brightness, consumption power and crosstalk.

Further, a display of active matrix mode, using a polycrystalline silicon (polysilicon) film or a continuous grain boundary silicone (CG silicon) film, manifests higher electric charge mobility than an amorphous silicon film, therefore, it can treat TFT with large electric current and is suitable for driving of organic EL which is a current driven element. Since polysilicon TFT and CG silicon TFT can move at high speed, various control circuits, conventionally treated by exterior IC, are formed on the same substrate as for a display pixel, and there are a lot of merits such as reduction of the size, lowering the cost, multi-functioning and the like of a display.

Figure 10:
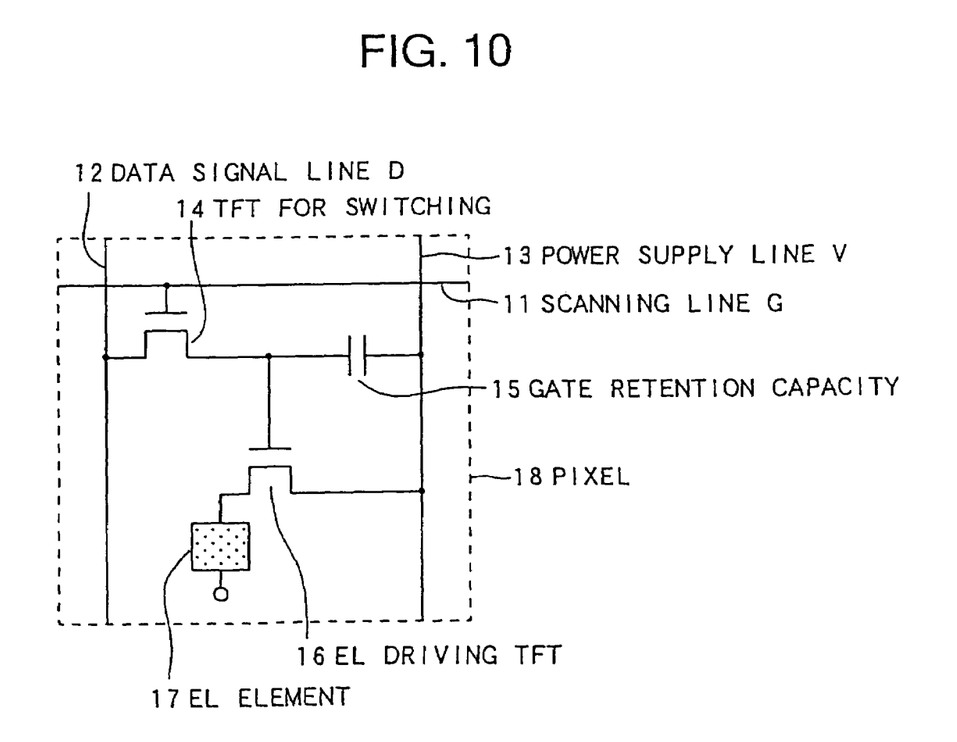
FIG. 10 is a circuit diagram showing the constitution of a pixel of an active driving organic EL display.
Figure 11:
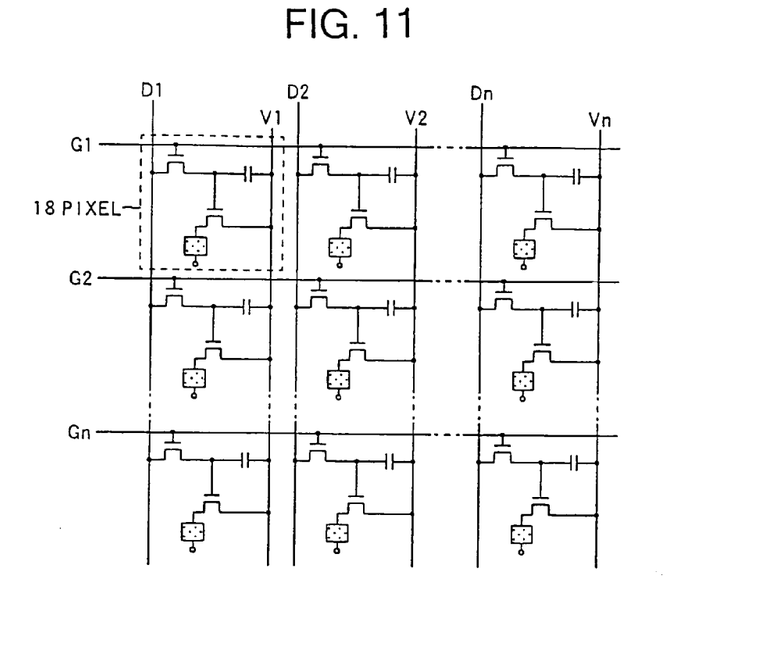
FIG. 11 is a constitutional view showing the constitution of a matrix pixel of an active driving organic EL display.

FIG. 10 shows a typical pixel circuit constitution of an active matrix organic EL display. In addition to bus lines such as a scanning line G 11, data signal line D 12 and power supply line V 13, the apparatus comprises switching TFT 14, gate retention capacity 15, driving TFT 16 and EL element 17. When a gate of switching TFT, selected by the scanning line G, is opened and signal voltage corresponding to emitting strength is applied from the date signal line D to a TFT source, a gate of driving TFT is opened in analoguewise responding to magnitude of signal voltage, and this condition is retained in gate retention capacity. When voltage is applied from the power supply line V to a source of driving TFT, electric current corresponding to the degree of opening of a gate flows into an EL element, to cause light emission in gradation depending on the magnitude of signal voltage. FIG. 11 shows the structure of an actual display in which pixels 18 are placed in a form of matrix.

Even under passive matrix mode, a simple display having a small number of scanning lines can realize a practical apparatus utilizing the simplicity of the structure. Further, development of a phosphorescent emitting material is being progressed in addition to conventional fluorescent emitting materials, and emitting efficiency is improved significantly. By utilizing these light emitting materials having high light emitting efficiency, there is a possibility of solving the conventional problem in the passive matrix mode.

Figure 9:
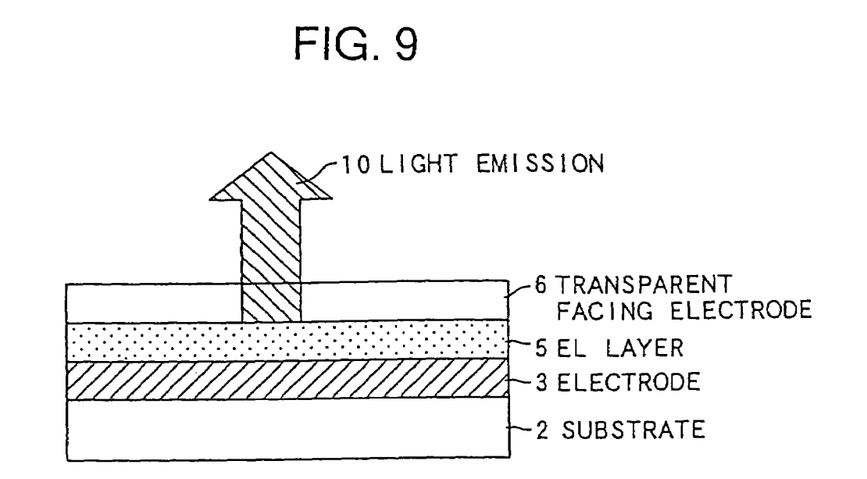
FIG. 9 is another sectional constitutional view of an organic EL element.

Also a top emission structure, in which light emission 10 is taken out toward the opposite direction of a substrate as shown in FIG. 9, is under investigation. In contrast to the top emission structure, a structure shown in FIG. 8 is called a bottom emission structure in some cases. In the top emission structure, particularly in a display of active matrix mode, the light emitting area rate is not limited by circuit constitutions such as TFT and bus lines, so that higher multi-functional and complicated circuits can be formed. Therefore, they are being developed as a promising technology.

In the present invention, any of the above mentioned technologies may be used in organic EL.

The method of attaining colorization includes a CF mode in which a white light emitting layer and color filters (CF) of three colors R, G and B are combined, and a CCM (Color Changing Medium) mode in which a blue light emitting layer and an R and G fluorescent converting dye filter are combined, in addition to a three color juxtaposition mode in which organic EL materials of the most basic three colors R, G and B are precisely placed per each pixel of a display.

When colorization modes are compared, in the CF method, a white light emitting material is necessary, and an apparent white organic EL material for illumination use is realized. However, a real white organic EL material having spectra of three colors R, G and B is not realized yet, and there is a shortcoming that the utilizing efficiency of light emission will become one-third, due to the use of color filters.

In the CCM mode, only a blue emitting material is used, therefore, its light emitting efficiency and R-G converting efficiency of a CCM filter are important. However, sufficient efficiency cannot be obtained easily, and is not practical yet. The CF mode is insufficient in the point of color reproduction, in the same way that LCD of the CF mode has drawbacks in reproducing TV images. The CCM mode is also one kind of filter mode, and is common in the above respect, and the three color juxtaposition mode is excellent in color reproduction in that composition of each color light emitting material is slightly adjusted. Since the CF mode and CCM mode have shortcomings such as increase in the thickness of an element due to the use of filters, increase in the number of parts, and the like, thus the three color juxtaposition mode is favorable overall.

As the mode of forming three color juxtaposition fine pixels, a mask vacuum vapor deposition method is used in the case of a low molecular weight material, and in the case of a high molecular weigh material, it is made into a solution and an ink jet method, printing method, transferring method and the like are used. Recently, a low molecular weight material which can be coated is also being developed.

In the case of a three color juxtaposition color display, the mask vacuum vapor deposition method of a low molecular weight material has a problem that it is difficult to respond to a large scale display and to produce a large number of displays using a large sized substrate, due to restriction of a vacuum apparatus and a vapor deposition mask. This means that there is no problem in manufacturing of trial manufacturing level in the development, however, requests of the market cannot be responded in terms of tact and cost in the full manufacturing stage. On the other hand, high molecular weight materials and low molecular weight materials which can be coated can be formed into a film by wet processes such as an ink jet method, printing method, casting method, layer-by-layer self-assembling method, spin coating method, dipping method and the like. Therefore, the above mentioned problems for responding to a large scale substrate are scarce, and particularly in the case of an ink jet method, manufacturing of a highly precise display is also possible so that this method can be the most promising method in the future.

In the mask vacuum vapor deposition method, when a light emitting material is selectively placed on a pixel portion, most of the material adheres to a mask, leading to remarkable decrease in material utilizing efficiency.

In contrast, the ink jet method is a method of the highest material utilizing efficiency since a light emitting material can be selectively placed only on necessary pixel portions.

In the present invention, treatment which may cause deterioration of the EL layer such as heating treatment is not carried out. And an organic EL element shown in FIG. 4, with film thickness distribution within a pixel, is used.

Figure 1:
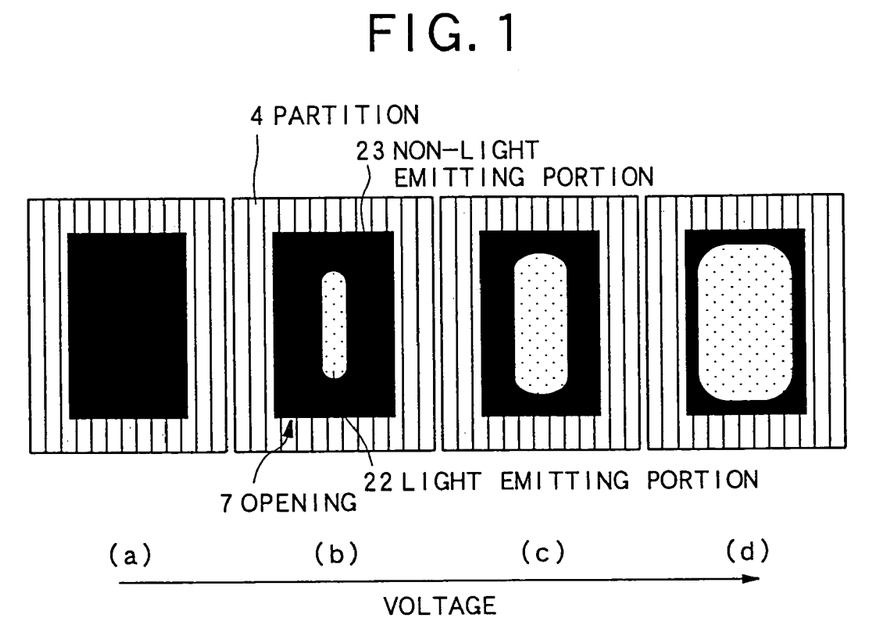
FIG. 1 is an explanatory view showing an operation of an electroluminescent element according to an example of the present invention.

In such an organic EL element, the inventors have found that, as shown in FIG. 1, the light emitting region is increased and decreased by voltage variation. FIG. 1(a) shows a state in which the voltage is below light emitting threshold. As the voltage increases, the region of the light emitting portion 22 gradually increases, and the light emitting region is saturated as shown in FIG. 1(d).

Conventionally, for example, by an ink jet method, details are explained in "Color Polymer EL Display", Vol. 22, No. 11, O plus E, p1433–1440 by Inoue and "Characterization of Light-emitting Polymer Devices Prepared by Ink-jet Printing", We-07, Proceedings of The 10$^{th}$ international Workshop on Inorganic and Organic Electroluminescence" by Morii et al. However, the phenomena which the inventors have found are not described in them.

In paragraph No. 0010 of JP-A No. 2002-164181, there is a description that if a part of the EL layer is thin within the facing electrode region, electric field will concentrate to the thin EL layer part, and light emission will occur only at the thin EL layer part. However, the thickness of the thin EL layer stated here is extremely thin such that the facing electrode will short-circuit. If the film thickness is such that short-circuit of the electrode will not occur, the above phenomenon will not usually occur.

In the present invention, the phenomenon as in the above mentioned JP-A No. 2002-164181 will not occur by forming the thinnest part of the light emitting layer by a thickness of not less than 10 nm, preferably not less than 20 nm within the element region where an electric field is applied to a pair of facing electrodes. Further, in the element region where an electric field is applied to a pair of facing electrodes, by forming the thickness of the thickest part of the light emitting layer is within 300%, preferably within 200% of the thickness of the thinnest part, an element in which the light emitting region is increased and decreased by the voltage variation, as shown in FIG. 1, can be manufactured stably. If the thickness of the thinnest part is too thin, short-circuit of the electrodes will be a problem as mentioned above. On the other hand, if it is too thick, voltage to apply an efficient electric field to the light emitting layer will be high, so that 500 nm is a practical upper limit.

The statement "preferably" for the thinnest film thickness and the thickness ratio of the thickest film thickness to the thinnest film thickness shows that better reproduction stability can be obtained, manufacturing yield can be improved and cost superiority can be improved by substituting each first constitutional region with the second constitutional region.

In the present invention, the light emitting layer is preferably a meniscus shape, that is, concave shape in which the center part is the thinnest part or convex shape in which the periphery part is the thinnest part. Particularly, since it is easy to be formed, concave shape in which the center part is the thinnest part is preferable. In view of preventing electrode formed on the light emitting layer from disconnecting, these meniscus shapes are preferably formed with gently-sloping surfaces.

Figure 2:
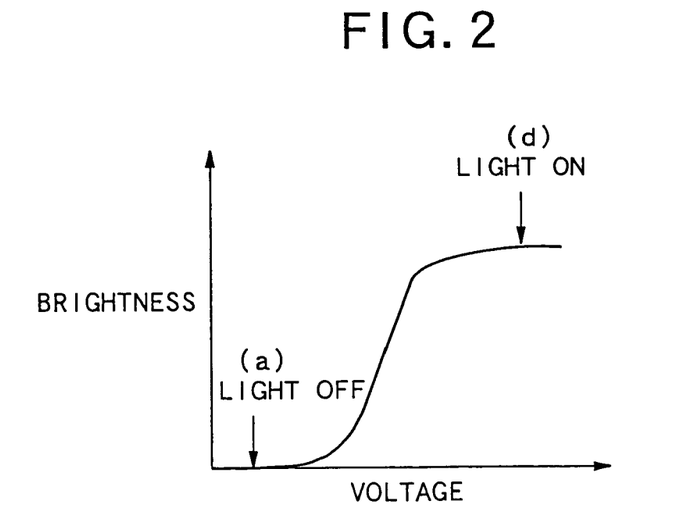
FIG. 2 is a property view showing an operational property of an electroluminescent element according to an example of the present invention.

FIG. 2 is a pattern diagram of the element light emitting brightness property shown in FIG. 1 of the present invention. FIG. 1(a) shows a state in which the voltage is below light emitting threshold. As the voltage increases, the region of the light emitting portion 22 gradually increases. As the voltage increases as in FIG. 1(b), FIG. 1(c) and FIG. 1(d), the brightness per unit area locally increases as the light emitting region increases. However, since the light emitting region will be saturated at a certain voltage, it appears to have a gentle non-liner property. This gentle non-liner property derives from the saturation of the light emitting region. Therefore, it is the same for an electric current.

To drive the organic EL element of the present invention as a display, a digital gradation driving method is preferable.

As the circuit constitution and driving method of an organic EL display, other than the basic circuit constitution of FIG. 10 and FIG. 11, a method in which the number of TFT is further increased such as "Pixel-Driving Methods for Large-Sized Poly-Si AM-OLED Displays" Asia Display/IDW'01 P. 1395–1398 by Yumoto et al. is reported. However, these are basically conventional analogue gradation driving methods in which the brightness is controlled according to an optional voltage or current of the voltage-brightness property or current-brightness property of the organic EL element.

In the organic EL element of the present invention, the brightness of these elements, which are pixel unit of the display, changes according to two different factors, increase and decrease of the light emitting region, and increase and decrease of the local brightness. Therefore, from practical aspect such as evenness and reproduction property within a display surface of certain area or more, it is difficult to control the brightness accurately according to an optional voltage or current.

In contrast, with the digital driving method as shown in FIG. 2 in which off state is controlled by the state of FIG. 1(a), and on state is controlled by the state of FIG. 1(d), control of the brightness is easy and effective.

To carry out gradation display required for a display by a digital driving method, it is effective to use a time divisional gradation driving method, an area divisional gradation driving method or a combination of the time divisional gradation driving method and area divisional gradation driving method.

Techniques for digital gradation driving of an organic EL element include time divisional gradation by Mizukami et al. "6-bit Digital VGA OLED" SID'00 P. 912–915, area division gradation by Miyashita et al. "Full Color Displays Fabricated by Ink-Jet Printing" Asia Display/IDW'01 P. 1399–1402 and a combination of the time divisional gradation and area divisional gradation "Color Polymer EL Display", Vol. 22, No. 11, O plus E, p1433–1440 by Inoue.

The above are to compensate the influence of the variation of driving TFT (16 of FIG. 10) within the display, in case of an active matrix display. In formation of a polysilicon thin film on a substrate, the above are employed because a technique to form an even film, which determines mobility of polysilicon film such as size of a crystal grain and control of grain boundary, is not sufficiently developed.

In other words, if the technique for forming an even polysilicon film is improved, necessity will decrease because the above mentioned analogue gradation is advantageous in basic property such as multitude of gradation numbers and low power consumption.

In contrast, in the present invention, the digital gradation driving method is essentially necessary. It is till important even though the technique for forming an even polysilicon film is improved. Also, it is important in the passive matrix displays.

As mentioned above, the present invention is naturally not known, but also is clearly different from any of the known technique, and the effect is remarkable.

Figure 12:
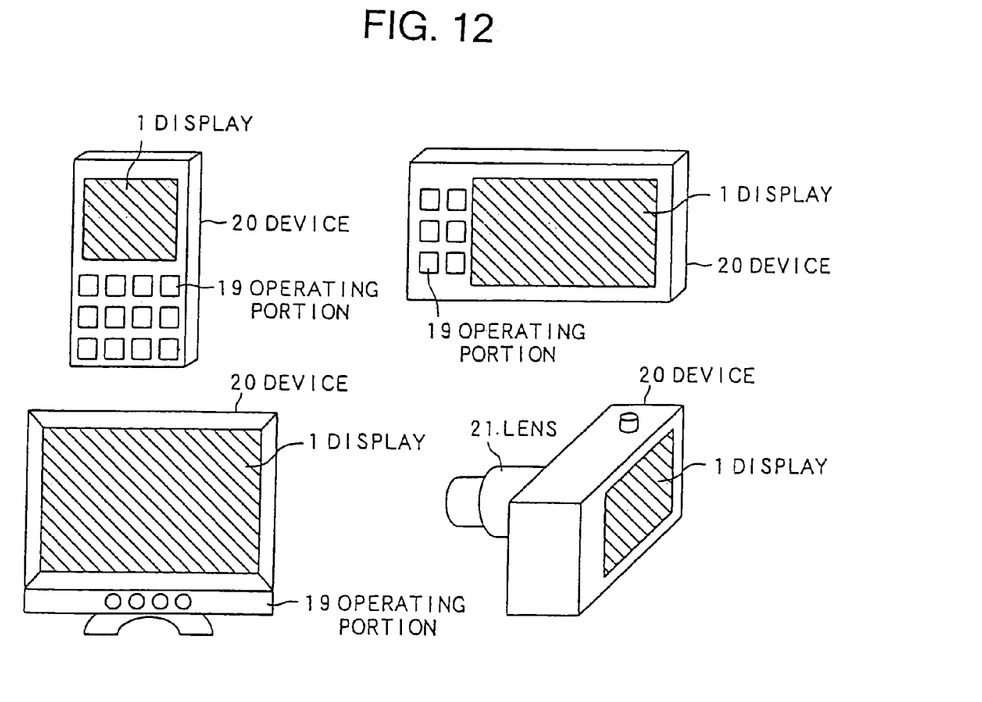
FIG. 12 is an example of an electronic device equipped with a display of the present invention.

As device 20 shown in FIG. 12 equipped with a display 1, provided by using the above mentioned present invention, a portable telephone provided with an operating portion 19 and a terminal of PDA (Personal Digital Assistant) type, PC (Personal Computer), TV receiver set, video camera, digital camera, and the like can be listed.

The present application has been illustrated above, and the present application will be illustrated further in detail based on examples.

The present application is not limited to them.

EXAMPLES

Example 1

The following solution was prepared as an example of the present invention.

(Preparation of Organic EL Layer Forming Coating Solution)

| | |
|---|---|
| Polyvinylcarbazole | 70 parts by weight |
| Oxadiazole compound | 30 parts by weight |
| Coumarin 6 (* fluorescent dye) | 1 part by weight |
| 1,1,2-trichloroethane (solution) | 633 parts by weight |

* When the fluorescent dye is coumarin 6, green light emission having a peak at 501 nm, in the case of perylene, blue light emission having a peak at 460 to 470 nm, and in the case of DCM, red light emission having a peak at 570 nm was obtained, and these were used as light emitting materials of each color.

(Manufacturing of EL Display)

A substrate on which electrodes and partitions are formed as shown in the sectional form in FIG. 4 was prepared. Partitions are placed so as to cover the electrode ends so that the partitions act also as electrode insulating layer. As the electrode, a transparent electrode such as ITO, NESA film, IZO and the like was formed into a film in thickness of 2000 Å, and patterned by etching. The partition was formed to have a height of 5 μm using photosensitive acrylic resin.

A transparent electrode is used in an element structure of bottom emission, and a transparent substrate is used. It is also possible that a metal is used as an electrode to give a top emission element structure. Electrode opening part was formed into a rectangle shape of 100 μm×300 μm.

After cleaning of a substrate, PEDOT/PSS (polythiophene: Bayer CH8000) with hole injecting property was coated by a thickness of 80 nm by spin coating, and baked at 160° C. to form a so-called buffer layer. By an ink jet method, the above mentioned organic EL layer forming coating solution was discharged to pixel opening parts on PEDOT and dried at 80° C., thereby formed a light emitting layer. Subsequently, a MgAg alloy (Mg:Ag=10:1) was vapor-deposited to give a thickness of 150 nm, and on this, Ag was vapor-deposited to form a protective layer having a thickness of 200 nm, to form a cathode.

When an active matrix display is manufactured by using so-called TFT substrate, a cathode is formed on the entire surface, and in the case of manufacturing of passive matrix display, a cathode is formed in the form of stripes so as to cross at right angles with an electrode pattern on a substrate.

The shape of the light emitting layer was observed with an atomic force microscope (AFM), and meniscus shape as shown in FIG. 4 was confirmed. An attempt of forming a flat light emitting layer without meniscus shape by adjusting solvent, concentration, viscosity and the like of the light emitting layer ink. However, the attempt could not be attained. By the same procedure, a film was formed so as the thickness of the thinnest part of the light emitting layer within the element region where an electric field is applied to a pair of facing electrodes is 10 nm, and further, the thickness of the thickest part of the light emitting layer in the element region where an electric field is applied to a pair of facing electrodes is within 300% of the thickness of the thinnest part.

The light emission of the pixel opening part was observed by applying direct electric field to the electrodes, and increase and decrease of the light emitting region by the voltage variation as shown in FIG. 1 was confirmed.

As for this display, non-voltage applied state is an off state, and the light emitting region saturating voltage applied state is an on state. An image signal was input to the display by connecting a time divisional gradation display control circuit by 6 bit divisional signal, and color display with excellent displaying property could be obtained.

Example 2

The same procedure as in Example 1 was conducted except that a film was formed so as the thickness of the thinnest part of the light emitting layer within the element region where an electric field is applied to a pair of facing electrodes is 20 nm, and further, the thickness of the thickest part of the light emitting layer in the element region where an electric field is applied to a pair of facing electrodes is within 220% of the thickness of the thinnest part.

The light emission of the pixel opening part was observed by applying direct electric field to the electrodes, and increase and decrease of the light emitting region by the voltage variation as shown in FIG. 1 was confirmed.

As for this display, non-voltage applied state is an off state, and the light emitting region saturating voltage applied state is an on state. An image signal was input to the display by connecting a time divisional gradation display control circuit by 6 bit divisional signal, and color display with excellent displaying property could be obtained.

The same brightness could be obtained with lower voltage driving as compared with Example 1. Further, gradation inversion error has decreased and color display with improved image quality could be obtained.

Example 3

The same procedure as in Example 1 and 2 was conducted except that the element structure was formed into a 2 bit pixel divisional. As in Example 1 and 2, an image signal was input to the display by connecting display control circuit of a combination of a time divisional gradation by 4 bit divisional signal and a pixel divisional gradation by 2 bit divisional signal, and color display with excellent displaying property could be obtained.

Even though a number of time divisional gradation is fewer than Example 1 and 2, that is, circuit load is reduced by reducing driving frequency, total of 256 gradation was possible and so-called full color display could be attained. A time divisional gradation of 6 bit or more will not be a problem in a case of connecting an external driving IC. However, in a case of integrating a driving driver onto a substrate with polysilicon, the gradation driving method of the present Example is advantageous since an operation frequency will be a problem because its mobility is not high as crystalline silicon.

Examples of the present invention have been explained in the above. However, the present invention is not limited to the above.

What is claimed is:

1. An electroluminescent element comprising at least a substrate, an electrode formed on the substrate and an electric light emitting layer,
   wherein, in an element region where an electric field is applied to a pair of facing electrodes, an area of a light emitting region of the same electric light emitting layer changes according to a voltage applied to the electric light emitting layer.

2. The electroluminescent element according to claim 1 wherein the light emitting region changes with a change of brightness per unit area.

3. The electroluminescent element according to claim 1 wherein, in the element region where an electric field is applied to a pair of facing electrodes, a thickness of the thickest part of the light emitting layer is within 300% of the thickness of the thinnest part.

4. The electroluminescent element according to claim 2 wherein, in the element region where an electric field is applied to a pair of facing electrodes, a thickness of the thickest part of the light emitting layer is within 300% of the thickness of the thinnest part.

5. The electroluminescent element according to claim 3 wherein the thickness of the thickest part of the light emitting layer is within 220% of the thickness of the thinnest part.

6. The electroluminescent element according to claim 4 wherein the thickness of the thickest part of the light emitting layer is within 220% of the thickness of the thinnest part.

7. The electroluminescent element according to claim 3 wherein the thickness of the thinnest part of the light emitting layer is not less than 10 nm and not more than 500 nm.

8. The electroluminescent element according to claim 4 wherein the thickness of the thinnest part of the light emitting layer is not less than 10 nm and not more than 500 nm.

9. A display comprising the electroluminescent element according to claim 1 as a pixel unit wherein the display is driven by a digital gradation driving method in which a low voltage value at which the pixel dose not emit light is a non-selected state, and a high voltage value at which the light emitting region within the pixel is saturated is a selected state.

10. A display comprising the electroluminescent element according to claim 2 as a pixel unit wherein the display is driven by a digital gradation driving method in which a low voltage value at which the pixel dose not emit light is a non-selected state, and a high voltage value at which the light emitting region within the pixel is saturated is a selected state.

11. The electroluminescent display according to claim 1 wherein the digital gradation driving method is a time divisional gradation driving method, an area divisional gradation driving method or a combination of the time divisional gradation driving method and area divisional gradation driving method.

12. The electroluminescent display according to claim 2 wherein the digital gradation driving method is a time divisional gradation driving method, an area divisional gradation driving method or a combination of the time divisional gradation driving method and area divisional gradation driving method.

13. The electroluminescent display according to claim 1 wherein at least the light emitting layer of the electroluminescent element is formed by a wet process of an ink jet method, a printing method, a casting method, a layer-by-layer self-assembling method, a spin coating method, a dipping method or dispenser method.

14. The electroluminescent display according to claim 2 wherein at least the light emitting layer of the electroluminescent element is formed by a wet process of an ink jet method, a printing method, a casting method, a layer-by-layer self-assembling method, a spin coating method, a dipping method or dispenser method.

15. An electronic device using a display according to claim 1 as a displaying part.

16. An electronic device using a display according to claim 2 as a displaying part.

* * * * *